United States Patent
Kim et al.

(10) Patent No.: US 8,033,017 B2
(45) Date of Patent: Oct. 11, 2011

(54) METHOD FOR MANUFACTURING EVAPORATOR FOR LOOP HEAT PIPE SYSTEM

(75) Inventors: Chul-Ju Kim, Gyeonggi-Do (KR); Min-Whan Seo, Gyeonggi-Do (KR); Byung-Ho Sung, Seoul (KR); Jung-Hyun Yoo, Seoul (KR); Jee-Hoon Choi, Gyeonggi-Do (KR); Jae-Hyung Ki, Gyeonggi-Do (KR)

(73) Assignees: Zalman Tech Co., Ltd. (KR); Sungkyunkwan University Foundation for Corporate Collaboration (KR)

( * ) Notice: Subject to any disclaimer, the term of this patent is extended or adjusted under 35 U.S.C. 154(b) by 135 days.

(21) Appl. No.: 12/546,305

(22) Filed: Aug. 24, 2009

(65) Prior Publication Data

US 2009/0313828 A1    Dec. 24, 2009

Related U.S. Application Data

(63) Continuation of application No. PCT/KR2008/004495, filed on Aug. 1, 2008.

(30) Foreign Application Priority Data

Jun. 23, 2008  (KR) .................. 10-2008-0058984

(51) Int. Cl.
  *B23P 6/00*  (2006.01)
(52) U.S. Cl. .......... 29/890.032; 29/890.03; 165/104.26; 165/136; 165/168

(58) Field of Classification Search ............. 29/890.032, 29/890.03; 165/104.26, 136, 168
See application file for complete search history.

(56) References Cited

U.S. PATENT DOCUMENTS

| | | | | |
|---|---|---|---|---|
| 5,385,700 A | * | 1/1995 | Denton | .......................... 264/28 |
| 5,720,339 A | * | 2/1998 | Glass et al. | .............. 165/104.26 |
| 6,564,860 B1 | | 5/2003 | Kroliczek et al. | |

FOREIGN PATENT DOCUMENTS

| | | |
|---|---|---|
| JP | 9119789 A | 5/1997 |
| KR | 100497332 A | 6/2005 |
| KR | 1020060033624 A | 4/2006 |
| KR | 100671041 B1 | 1/2007 |

OTHER PUBLICATIONS

Korean Office Action; Application No. 10-2008-0058984; Issued Nov. 30, 2009; 4 pages.
International Search Report and Written Opinion of the International Searching Authority; PCT/KR2008/004495; Jan. 19, 2009; 6 pages.

* cited by examiner

*Primary Examiner* — Richard Chang
(74) *Attorney, Agent, or Firm* — St. Onge Steward Johnston & Reens LLC

(57) ABSTRACT

Provided is a method of manufacturing an evaporator for a loop heat pipe system including a condenser, a vapor transport line, and a liquid transport line, and more particularly, to a method of manufacturing an evaporator for a loop heat pipe system which provides a simple manufacturing process capable of improving a contact state between a sintered wick and a heating plate.

7 Claims, 8 Drawing Sheets

Heat

METHOD FOR MANUFACTURING EVAPORATOR FOR LOOP HEAT PIPE SYSTEM

CROSS-REFERENCE TO RELATED APPLICATIONS

The present application is a continuation of pending International patent application PCT/KR2008/004495 filed on Aug. 1, 2008 which designates the United States and claims priority from Korean patent application 10-2008-0058984 filed on Jun. 23, 2008, the content of which is incorporated herein by reference.

FIELD OF THE INVENTION

The present invention relates to a method of manufacturing an evaporator for a loop heat pipe system including a condenser, a vapor transport line, and a liquid transport line, and more particularly, to a method of manufacturing an evaporator for a loop heat pipe system which provides a simple manufacturing process capable of improving a contact state between a sintered wick and a heating plate.

BACKGROUND OF THE INVENTION

Electronic parts such as CPUs or semiconductor chips used for various electronic devices such as computers generate a large amount of heat during operation. Such electronic devices are usually designed to operate at room temperature. Accordingly, when heat generated during the operation of an electronic device is not effectively cooled down, the performance of the electronic device is severely deteriorated and, in some cases, the electronic device itself may be damaged.

As a method of cooling down heat generated by various electronic parts, many approaches have been developed such as a heat conduction method using a heat sink, a method of using natural convection or radiation of air, a force convection method using a fan, a method using circulation of liquid, or a submerged cooling method.

However, as nowadays many released electronic products are made slim, an installation distance between electronic parts generating heat during operation is continuously decreased so that heat is not appropriately cooled down. Also, since the heat load of electronic parts has continuously increased due to the high integration and high performance of the electronic parts, the above-described cooling methods are not able to effectively cool down the electronic parts.

As a new technology to solve the above problems, a phase change heat transport system which can cool down an electronic part having a high heat load density per unit has been introduced. A thermosyphon system and a cylindrical heat pipe system are examples of the phase change heat transport system.

According to the thermosyphon system, cooling is achieved using a natural circulation method via a liquid-vapor phase change and a specific gravity difference of working fluid. In a conventional cylindrical heat pipe, cooling is obtained by circulating the working fluid using a capillary pumping force generated by a sintered wick installed in an interior wall of a pipe.

However, in the thermosyphon system, a condenser section must be located higher than an evaporator section. Although this problem is less severe in the case of the heat pipe of the thermosyphon system, a heat transport ability of the heat pipe is quite deteriorated when the condenser section is located lower than the evaporator section in the field of gravity.

Accordingly, since there is a limitation in the positional relationship between the constituent elements in the above two systems, this limitation prevents electronic devices employing the above cooling systems from being made slim.

Also, since vapor and liquid flow in opposite directions in a linear pipe of the thermosyphon or the cylindrical heat pipe, the vapor and the liquid may be mixed in the middle of the pipe. Another problem is that the mixture may make the amount of heat actually transported less than that that can be ideally transported.

A loop heat pipe (LHP) system has been suggested as an ideal heat transport system which can solve these problems, that is, the positional limitation and the mixture between the vapor and liquid. The LHP system is a sort of a capillary pumped loop heat pipe (CLP) technology developed by the NASA, U.S.A., to cool down a large amount of heat generated from communications equipment or electronic equipment used for artificial satellites.

Korean Patent No. 671041 entitled "Loop Heat Pipe" discloses a technology about a compact loop heat pipe system. FIG. 1 illustrates a loop heat pipe system 110 according to this conventional technology. The conventional loop heat pipe system 110 includes a condenser 112, an evaporator 114, a vapor line 116, and a liquid line 118, which form a loop. The vapor line 116 and the liquid line 118 are connected between the condenser 112 and the evaporator 114. In the loop heat pipe system 110, a sintered wick 120 is installed only in the evaporator 114 unlike the conventional linear heat pipe of FIG. 1.

In the present specification, the loop heat pipe is referred to as a loop heat pipe system and both terms have the same meaning. Also, the evaporator and the condenser, respectively, have the same meanings as the evaporator section and the condenser section.

The loop heat pipe system 110 operates in the following manner. Heat is applied to a heating plate 122 which is the bottom portion of the evaporator 114 in which the sintered wick 120 is inserted. At that point the sintered wick 120 is saturated with the liquid phase of working fluid due because the heat transported to the sintered wick 120 contacting the heat plate 122. And the applied heat vaporizes the working fluid so that the phase of the working fluid is changed to a vapor state. The vapor is moved toward the condenser 112 along the vapor line 116 connected to a side of the evaporator 114. As the vapor passes through the condenser 112, heat is dissipated externally so that the vapor is liquefied. The liquefied working fluid is moved toward the evaporator 114 along the liquid line 118 at a side of the condenser 112. The above-described process is repeated so that the heat source can be cooled down.

In the evaporation of the working fluid permeated in the sintered wick 120, referring to FIG. 3 that is a cross-sectional view taken along line III-III of FIG. 2 and FIG. 4 showing the sintered wick 120 of FIG. 2 rotated by 180° for the convenience of explanation, a surface 126 of the sintered wick 120 facing the heating plate 122 includes a contact surface 126*b* contacting the heating plate 122 and a plurality of microchannels 126*a* working as a passage of the generated vapor. Accordingly, the sintered wick 120 receives heat via the contact surface 126*b* contacting the heating plate 120 so that the received heat makes the working fluid permeated in the sintered wick 120 evaporate. The generated vapor is moved toward the condenser 112 along the vapor line 116 connected to a side of the evaporating portion 114 through the microchannels 126*a* formed in the surface 126 facing the sintered wick 120.

On the other hand, the performance of an evaporator taking heat from a heat source like an electronic part is determined according to how well the heat transported from the heat source to a heating plate is transported to a sintered wick. In this connection, contact conductance is a factor directly affecting the heat transport between the heat source and the heating plate.

The contact conductance is related to the thermal resistance generated when a metal has a surface contact with another metal and heat transport occurs between the metals. The contact conductance is proportional to the contact area between the two metals. That is, as the contact area increases, the contact conductance increases, and as the contact conductance increases, heat transport is generated further.

However, in a method of manufacturing an evaporator employed in the conventional loop heat pipe system, since the sintered wick having the channels that are the passage of vapor is separately manufactured and then coupled to the heating plate, the manufacturing process is complicated and the state of a coupling surface is not satisfactory. Prior to a description about disadvantages, the conventional method of coupling the sintered wick to the heating plate includes a simple pressing method and a metal coupling method.

According to the simple pressing method, a contact portion of a previously manufactured metal sintered wick is processed/non-processed and a predetermined load is applied to the contact portion so that the sintered wick and the heating plate contact each other and are coupled to each other. In the metal coupling method, metal powder is previously sintered to form a sintered wick and a plurality of channels that are the passage of vapor are formed. After the sintered wick with the channels contacts the heating plate, the sintered wick and the heating plate are sintered again so that metallic coupling is formed between the sintered wick and the heating plate.

On the other hand, in the metal coupling method used for a conventional cylindrical heat pipe with sintered wick, when metal powder is sintered, an auxiliary jig is used to allow the metal powder to contact a heating boundary surface. Then, the metal powder is sintered and coupled to an inner wall of a metal pipe. For a cylindrical heat pipe, since a vapor generation position is not a boundary surface between metal and the sintered wick, but a surface of the sintered wick, a separate vapor passage is not needed so that a method of directly installing metal power on a metal pipe and sintering the metal powder may be used.

However, in order to manufacture the conventional evaporator used for a loop heat pipe system, since the sintered wick with the vapor passage is coupled to the heating plate and vapor is generated from the boundary surface between the sintered wick and the heating plate, the method of directly installing the metal powder to the heating plate and sintering the metal power as in the above-described cylindrical heat pipe cannot be used. Rather, a metal coupling method in which the vapor passage must be formed in a surface of the sintered wick, the side surface is installed on a metal heating plate, and the sintered wick is sintered needs to be used.

Consequently, in order to manufacture the conventional evaporator used for a loop heat pipe system, metal powder is sintered and the channels are formed in the sintered metal powder. Then, the sintered wick with the channels is coupled to the heating plate in the simple pressing method or metal coupling method. Accordingly, a manufacturing process is complicated and a manufacturing cost is high. In particular, since the coupling between the heating plate and the sintered wick is not satisfactory, a value of contact conductance is lowered so that heat transport is not effectively and sufficiently performed. Also, according to the metal coupling method of primarily sintering the metal powder as sintered wick first and then sintering the sintered wick again), changes in the shape, size, porosity, and permeability of the sintered wick due to the fact that the contraction rate of the sintered wick cannot be avoided.

Also, according to the conventional method of manufacturing an evaporator for a loop heat pipe system, the manufactured evaporator has a relatively low contact conductance value as the contact area between the sintered wick and the heating plate is reduced by the existence of the vapor passage (the micro-channels). That is, referring to FIG. 3 showing a cross-section in which the heating plate 122 and the sintered wick 120 having the vapor passage (the micro-channels 126a) are coupled to each other, viewed in a direction making 90° with the direction of the cross section of FIG. 2, the size of the contact surface 126b where the sintered wick 120 and the heating plate 122 contact each other is reduced by the vapor passage so that the amount of heat cannot be sufficiently transported.

SUMMARY OF THE INVENTION

The present invention provides a method of manufacturing an evaporator for a loop heat pipe system by which not only a simple manufacturing process and a low manufacturing cost are possible but also a contact state between a sintered wick and a heating plate is improved, thereby increasing a value of contact conductance.

According to an aspect of the present invention, there is provided a method of manufacturing an evaporator for a loop heat pipe system, the method including processing a plurality of grooves, each having a concave and lengthy shape, in a surface of a heating plate that is formed of metal, filling the grooves of the heating plate with a groove filling material comprising a sublimate solid material, preparing a jig to be separated from the side surface of the heating plate where the grooves are formed, filling a space formed between the side surface of the heating plate and the jig with metal powder, and sintering the metal powder by applying heat to the metal powder to form a porous sintered wick.

The sublimate solid material of the above evaporator for a loop heat pipe system may be naphthalene.

The groove filling material may include an organic solvents.

The organic solvents may include at least one of ether and alcohol.

The metal powder may be nickel and the heating plate may be copper, the sintering operation may include a heating section in which temperature increases from a start temperature to a temperature maintenance temperature, a temperature maintenance section in which the maintenance temperature may be maintained for a predetermined maintenance time, and a cooling section in which the maintenance time may be cooled down to the start temperature, in the heating section, a heating time may not be greater than 10 minutes and a heating speed is 60-80° C./min, in the temperature maintenance section, the maintenance temperature may be within a range of 600-800° C. and a maintenance time is within a range of 5-30 minutes, in the cooling section, a duration time of cooling may be within a range of 30-60 min, and environment during the sintering operation may be a vacuum state within a range of not more than $10^{-3}$ Torr or an inactive gas environment.

In the groove processing operation, each of the grooves may have side surfaces separated from each other to face each other and a bottom surface and the side surfaces may be processed to have a predetermined height and, in the groove filling operation, the groove filing material may fill each of the grooves except for at least upper portions of the side surfaces of each groove.

In the groove filling operation, an upper surface of the groove filling material filling each of the grooves may have one of an downwardly bulging shape, an upwardly depressed shape, and a flat shape.

DETAILED DESCRIPTION OF THE INVENTION

Figure 1:
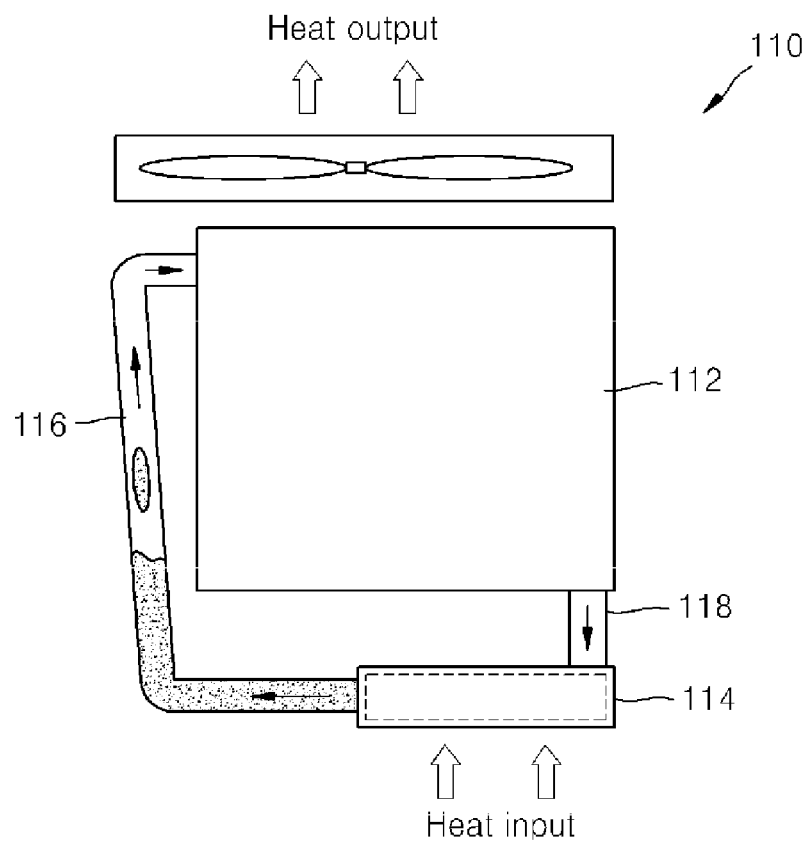
FIG. 1 illustrates the concept of a conventional loop heat pipe system.
Figure 2:
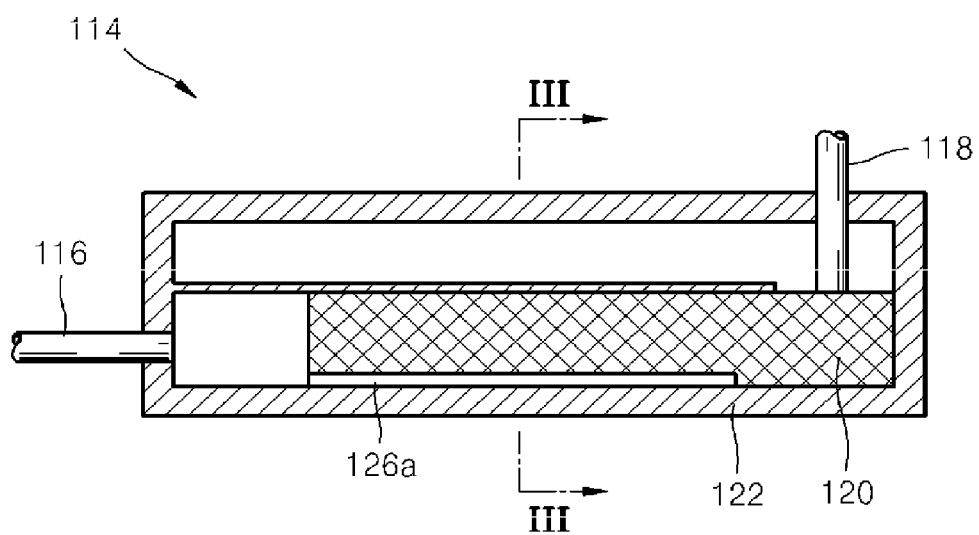
FIG. 2 is a cross-sectional view of the evaporator of FIG. 1.
Figure 3:
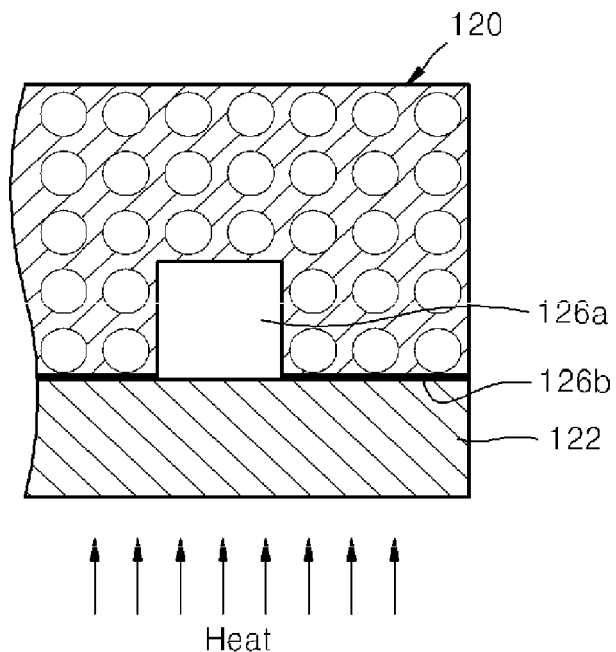
FIG. 3 is a cross-sectional view taken along line III-III of FIG. 2.
Figure 4:
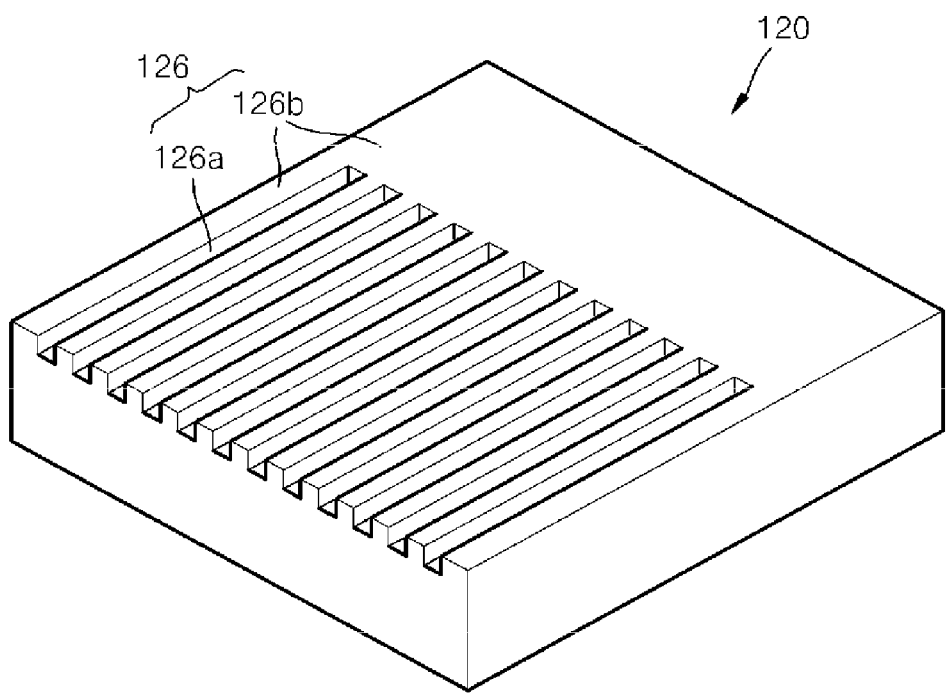
FIG. 4 is a perspective view of the sintered wick of FIG. 2 rotated by 180°.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 5:
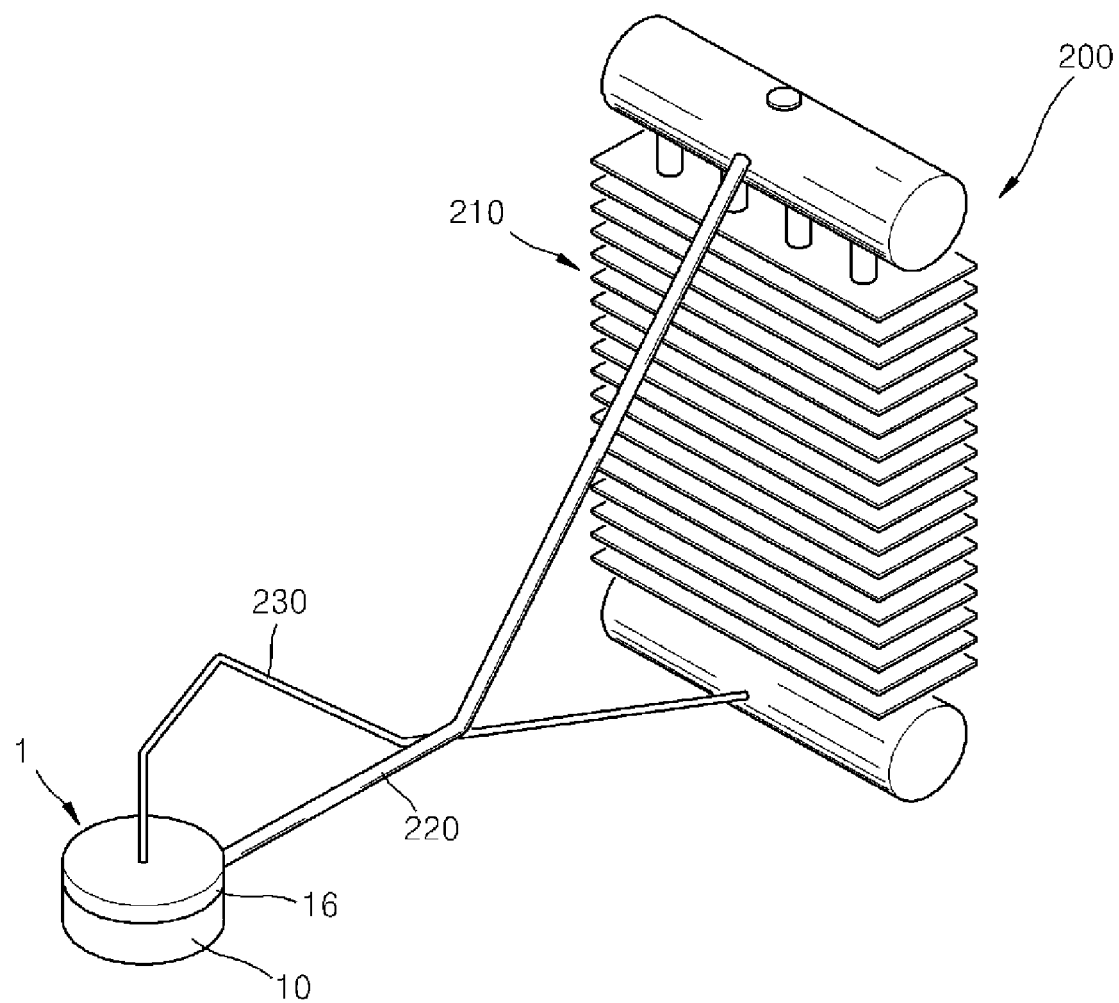
FIG. 5 is a perspective view of a loop heat pipe system including an evaporator manufactured in a method according to an embodiment of the present invention.
Figure 6:
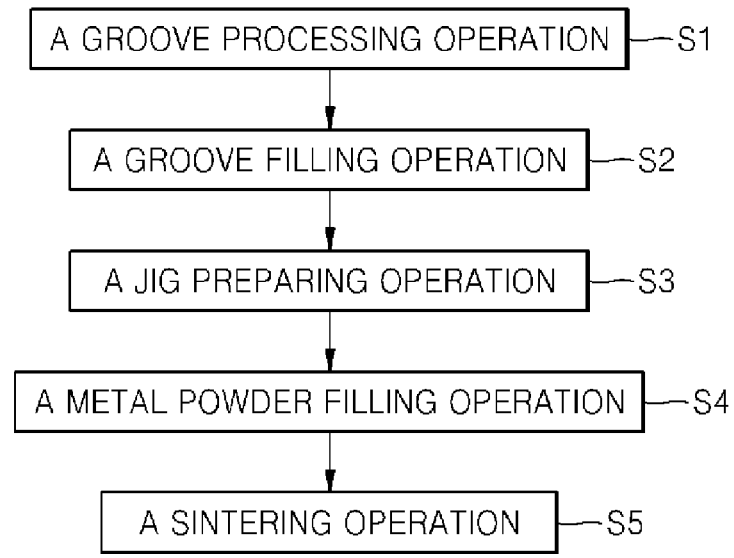
FIG. 6 is a flowchart for explaining a method of manufacturing an evaporator for a loop heat pipe system according to an embodiment of the present invention.

The present invention is related to an evaporator for a loop heat pipe system including a condenser, a vapor transport line, and a liquid transport line. FIG. 5 is a perspective view of a loop heat pipe system 200 including an evaporator 1 manufactured in a method according to an embodiment of the present invention. Referring to FIG. 5, the loop heat pipe system 200 includes the evaporator 1, a condenser 210, a vapor transport line 220, and a liquid transport line 230.

The condenser 210 changes the phase of working fluid in a vapor state received from the evaporator 1 to a liquid state. The condenser 210 takes heat from the working fluid and exhausts the heat to the outside air.

The vapor transport line 220 is a pipe member connecting the evaporator 1 and the condenser 210 to supply the vapor whose phase is changed by the evaporator 1 back to the condenser 210. The liquid transport line 230 is a pipe member connecting the condenser 210 and the evaporator 1 to supply the liquid whose phase is changed by the condenser 210 back to the evaporator 1. The general operations of the condenser 210, vapor transport line 220, and the liquid transport line 230 are the same as those described in the background section.

The method of manufacturing an evaporator for a loop heat pipe system according to an embodiment of the present invention will be described with reference to FIGS. 6-14. The method of manufacturing an evaporator for a loop heat pipe system according to an embodiment of the present invention includes a groove processing operation S1, a groove filling operation S2, a jig preparing operation S3, a metal powder filling operation S4, and a sintering operation S4. In the groove processing operation S1, a plurality of grooves 20 formed in strips, each having a concave and lengthy shape, are processed at a surface of a heating plate 10 formed of metal.

Figure 7:
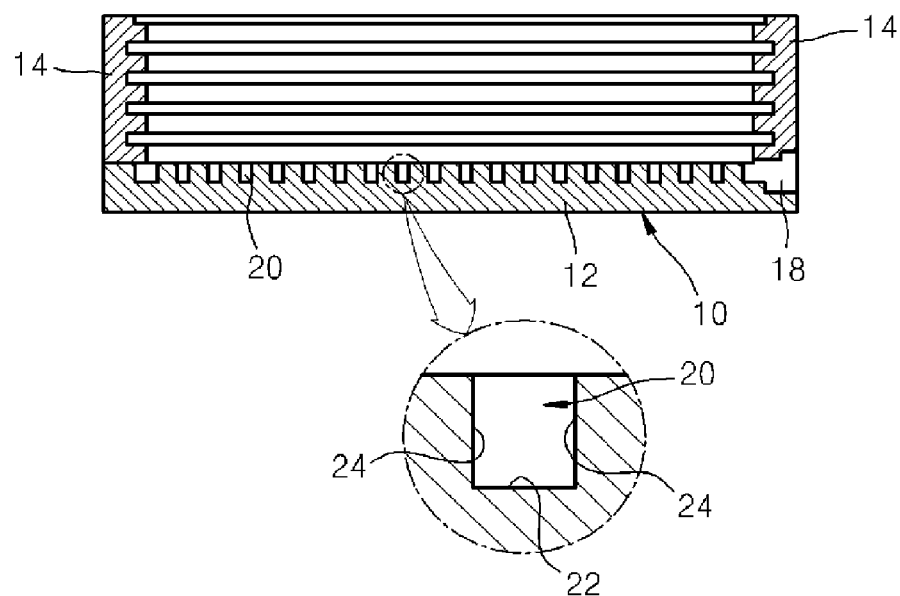
FIG. 7 is a cross-sectional view of the heating plate formed of metal in which the grooves are formed.

FIG. 7 is a cross-sectional view of the heating plate 10 in which the grooves 20 are formed. The heating plate 10 is formed of metal and receives heat from a heat source such as electronic parts that generate heat during operation.

In the present embodiment, the heating plate 10 includes a lower plate portion 12 and a side wall portion 14. The lower plate portion 12 has a disc shape. The side wall portion 14 extends upwardly from the circumferential portion of the lower plate portion 12. The lower plate portion 12 and the side wall portion 14 may be integrally formed or coupled together after being manufactured separately. The lower surface of the lower plate portion 12 contacts the heat source and receives heat from the heat source. The heat transported to the lower plate portion 12 is transported to the side wall portion 14 connected to the lower plate portion 12 by conduction.

In the present embodiment, the "side surface" of the heating plate 10 has the same meaning as an "inner side surface" indicating an inner surface facing an upper surface of the lower plate portion 12 and the inside of the side wall portion 14. In the groove processing operation S1, the grooves 20 formed in strips, each having a concave and lengthy shape, are processed using mechanical equipments such as a lathe.

An outlet 18 to which the vapor transport line 220 is connected is formed in the heating plate 10 so that a vapor can be exhausted. Each of the grooves 20 is processed to connect to the outlet 18. Accordingly, vapor generated in the grooves 20 can be exhausted to the vapor transport line 220 via the outlet 18.

In the present embodiment, the grooves 20 are processed to be separated from one another at a predetermined interval. Each of the grooves 20 is processed into a groove having both side surfaces 24 separated from each other and facing each other and a bottom surface 22. Both side surfaces 24 are symmetrical to a central axis and have a predetermined height. Also, in the present embodiment, although the grooves 20 formed in the lower plate portion 12 are all lengthy and linear, since the lower plate portion 12 is circular, the length of each groove 20 is such that the length of a pair of the grooves 20 symmetrical to the center of the lower plate portion 12 is the same, but different from that of other pairs.

The grooves 20 formed in the side wall portion 14 are processed along the inner side surface of the side wall portion 14. Each of the grooves 20 formed on the side wall portion 14 has a ring shape. Also, the grooves 20 formed in the side wall portion 14 are processed to connect to the outlet 18.

As in the present embodiment, when the lower plate portion 12 of the heating plate 10 and the side wall portion 14 are formed of separated members, the grooves 20 are first processed in each of the members and then the two members are combined together. However, when the lower plate portion 12 and the side wall portion 14 are integrally formed, the grooves 20 are sequentially or simultaneously processed in a single process.

Next, the groove filling operation S2 is performed. In the groove filling operation S2, each of the grooves 20 formed in the heating plate 10 is filled with a groove filling material 30 including a sublimate solid material. The groove filling material 30 is filled throughout the overall length of each of the grooves 20.

Figure 8:
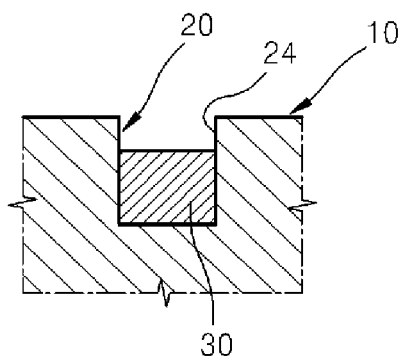
FIG. 8 is an imaginary cross-sectional view taken in a direction perpendicular to the lengthwise direction of the groove of FIG. 7.

FIG. 8 is an imaginary cross-sectional view taken in a direction perpendicular to the lengthwise direction of the grooves 20 of FIG. 7. Referring to FIG. 8, the groove filling material 30 fills the grooves 20 to have a rectangular section. The shape of the groove filling material 30 filling the grooves 20 is maintained at room temperature. Accordingly, when the grooves 20 are filled with metal powder in the next operation, that is, in the metal powder filling operation S4, the metal powder fills the remaining space of each of the grooves 20 that is already filled with the groove filling material 30. That is, the reason for filling the grooves 20 with the groove filling material 30 is to prevent the metal powder from intruding into a space functioning as a passage of vapor in the grooves 20 in the metal powder filling operation S4.

The groove filling material 30 includes a sublimate solid material. The sublimate solid material is in a solid state at room temperature. As the sublimate solid material is heated in the sintering operation, the phase of the sublimate solid material is changed from a solid state to a gas state so that the gas is exhausted externally. In the present embodiment, the sublimate solid material is naphthalene. However, in addition to naphthalene, the sublimate solid material may be replaced by other material having a sublimate characteristic and capable of maintained a shape thereof at room temperature.

Figure 11:
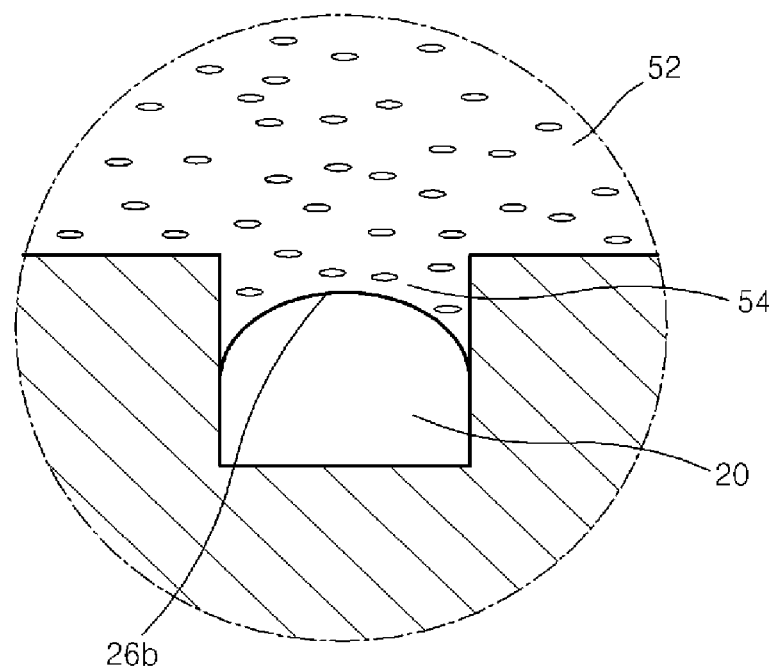
FIGS. 11-13 illustrate a variety of shapes of the sintering body in the groove.
Figure 12:
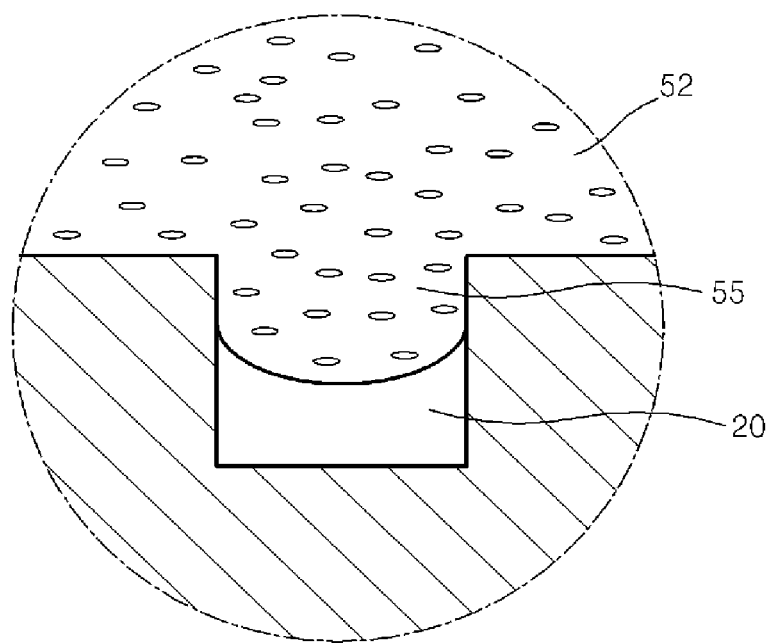

In the present embodiment, the groove filling material 30 includes an organic solvents. When the organic solvents is included in the groove filling material 30 and the amount thereof is appropriately adjusted, the sublimation time of the sublimate solid material can be adjusted as desired. When the sintering of the metal powder in the sintering operation and the sublimation time of the sublimate solid material can be adjusted together, in the sintered wick formed by the sintering, the shape of the lower surface of an intrusion portion of the groove filling material 30 intruding into each of the grooves 20 can be variously adjusted. That is, even when the grooves 20 are filled with the groove filling material 30 flatly as shown in FIG. 8 and then with the metal powder and sintering is performed in such a state, the shape of the lower surface of the intrusion portion after the sintering may be depressed upwardly or bulging downwardly as shown in FIGS. 11 and 12.

The organic solvents may be either ether or alcohol, or a mixture thereof. However, according to an embodiment, the groove filling material 30 may not include the organic solvents and be formed of only the sublimate solid material. In the present embodiment, the groove filling material 30 fills each of the grooves 20, except for at least the upper portions of both side surfaces 24 of each of the grooves 20. Referring to FIG. 8, each of the grooves 20 is filled with the groove filling material 30 to a height of about ⅔ of the overall height of each of the grooves 20, by leaving the upper portion of each of the grooves 20 empty. In other words, the groove filling material 30 fills the lower portion of each of the grooves 20, except for the upper portion thereof, not the entire portion of each of the grooves 20. In the meantime, according to an embodiment, the groove filling material 30 may fill the entire portion of the inner space of each of the grooves 20.

In the present embodiment, although the upper surface of the groove filling material 30 filling each of the grooves 20 is flat, in other embodiments, the upper surface may bulge upwardly or depressed upwardly. That is, the upper surface of the filling material 30 may be deformed to a desired shape considering the shapes of the metal powder filling each of the grooves 20 later and a sintered metal wick. As described above, although the shape of the lower surface of the intrusion portion in each of the grooves 20 by the metal sintered wick formed by sintering may be adjusted by including the organic solvents in the groove filling material 30, the shape of the lower surface may be adjusted by adjusting the shape of the upper surface of the groove filling material 30.

Figure 9:
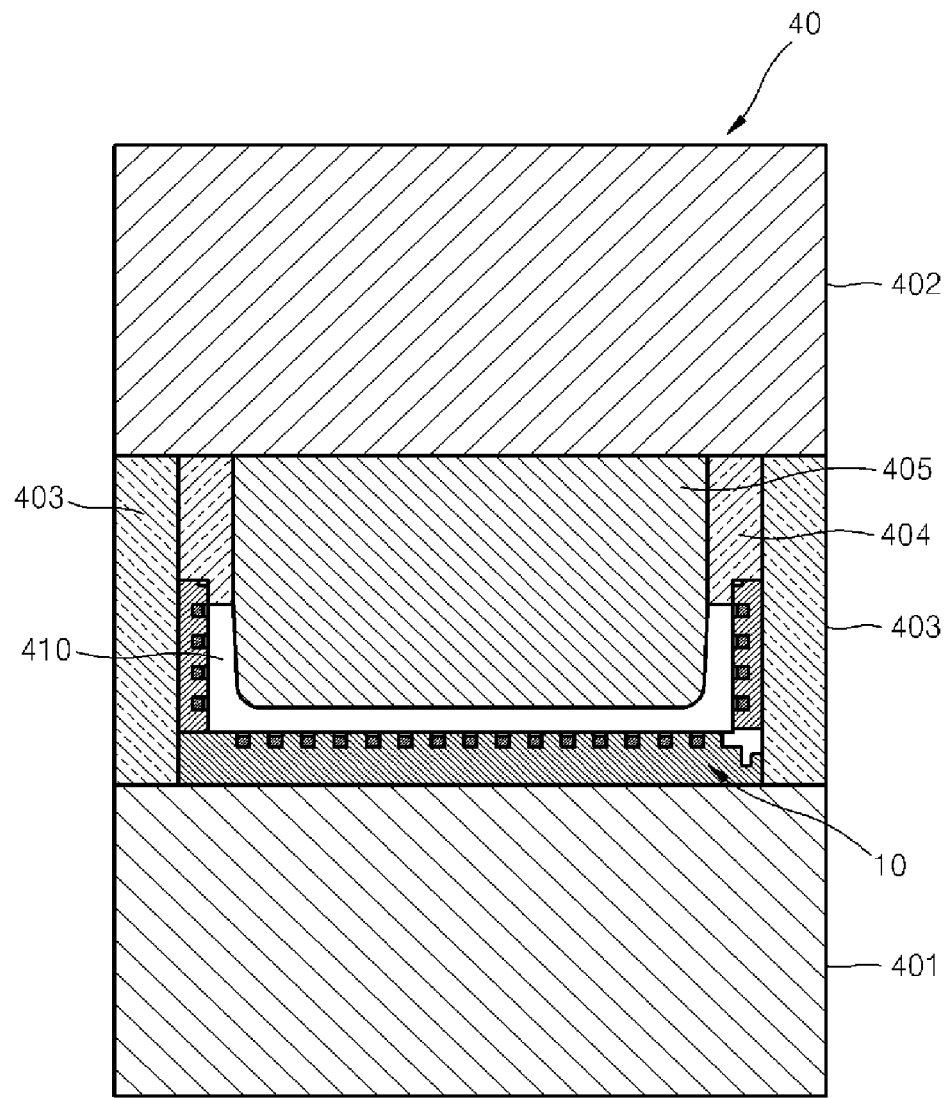
FIG. 9 is a cross-sectional view in a state in which a jig is provided.

Next is the jig preparation operation S3, in which the jig 40 is provided to be separated from a surface of the heating plate 10 where the grooves 20 are formed. Referring to FIG. 9, the jig 40 is arranged to face a surface of the heating plate 10 where the groove 20 are formed and be separated a predetermined distance from the side surface of the heating plate 10. A space 410 to be filled with metal powder is secured between the jig 40 and the heating plate 10. The jig 40 may be provided by being separated into two or more according to an embodiment. In the present embodiment, the jig 40 includes four separation jigs 402, 403, 404, and 405. A lower auxiliary jig 401 that is auxiliarly used is provided under the heating plate 10. Both of the jig 40 and the lower auxiliary jig 401 are formed of carbon graphite.

In the metal powder filling operation S4, the space 410 formed between the side surface of the heating plate 10 and the jig 40 is filled with metal powder. The metal powder filling operation S4 may not always be performed only after the jig preparation operation S3 is completed. After the jig 40 is provided so as to form the space 410 between the side surface of the heating plate 10 and the jig 40, the space 410 is filled with metal powder and the remaining jigs are provided. In the present embodiment, the jigs 402 and 404 are provided at desired positions after the space 410 is filled with a metal powder 50 (please refer to FIG. 10).

Figure 10:
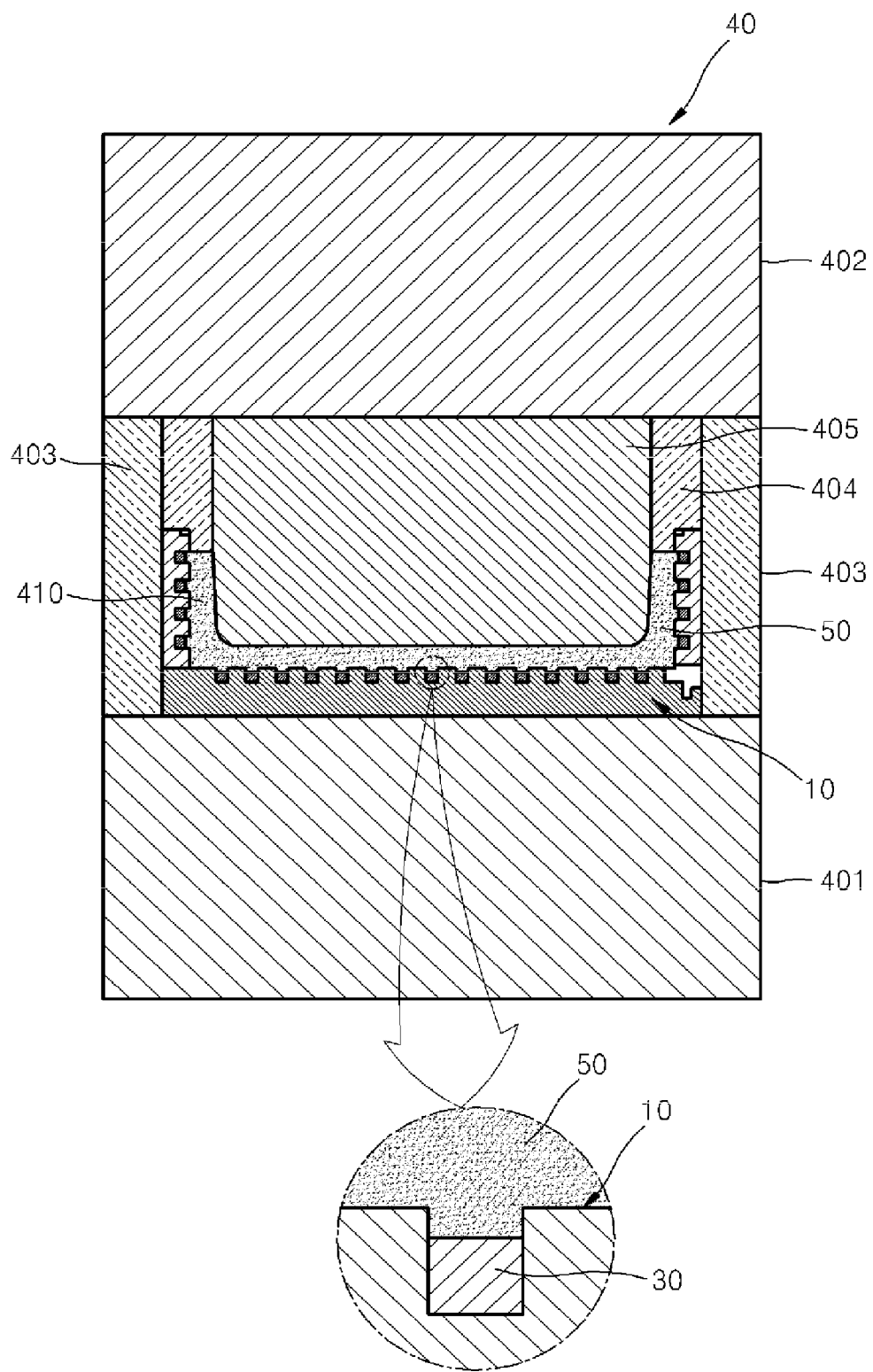
FIG. 10 is a cross-sectional view in a state in which metal powder is fulfilled in the state of FIG. 9.

The jig 40 is preferably configured so that the metal powder 50 filling the space 410 can be appropriately pressed to be firm. The number of separation of the jig 40 or the order of filling the space 410 with the metal powder may be variously changed as far as the space filled with the metal powder is maintained as shown in FIG. 10.

In the sintering operation S5, the metal powder 50 is heated to a temperature close to a melting point so that particles of the metal powder 50 are combined on a boundary surface between the particles of the metal powder 50, or partially deposited to be connected one another, forming a lot of pores therein, into a single body, so that a porous sintered wick is formed. In particular, according to the manufacturing method of the present invention, a metal powder sintered wick is formed and simultaneously combined on a surface of the heating plate 10 that is formed of metal. That is, the sintering of the metal powder and the combination with the heating plate 10 are performed in a single process, not in separate processes. A heating temperature is appropriately determined according to the metal powder that is in use. As shown in FIG. 10, the metal powder 50, the jig 40, and the heating plate 10 are heated in a combined state.

The groove filling material 30 filling each of the grooves 20 is sublimated in the sintering operation S5. Accordingly, when the sintering is completed, the space occupied by the groove filling material 30 in each of the grooves 20 becomes empty so as to be used as a passage of vapor.

As described above, the shape of the lower surface of the intrusion portion of the groove filling material 30 intruding into each of the grooves 20 can be adjusted by including the organic solvent/aqueous solution in the groove filling material 30 and adjusting the sublimation time of the sublimate solid material. Also, the shape of the lower surface 26b of the intrusion portion intruding into each of the grooves 20 can be adjusted by adjusting the shape of the upper surface of the groove filling material 30.

In the present embodiment, the groove filling material 30 includes the sublimate solid material and the organic solvents. Accordingly, as shown in FIG. 8, although the groove filling material 30 fills each of the grooves 20 with a flat upper surface, the shape of the lower surface of an intrusion portion 54 in each of the grooves 20 of a sintered body 52 can be depressed upwardly as shown in FIG. 11, by facilitating the sublimation time. Also, by adjusting the amount of the organic solvents to control the sublimation time, the lower surface of an intrusion portion 55 of the sintered body 52 can be formed to bulge downwardly as shown in FIG. 12. However, although the lower surface of the insertion portion of the sintered body 52 may not be smooth as shown in the drawings, when viewed as a whole, the lower surface is depressed upwardly or bulges downwardly.

Figure 13:
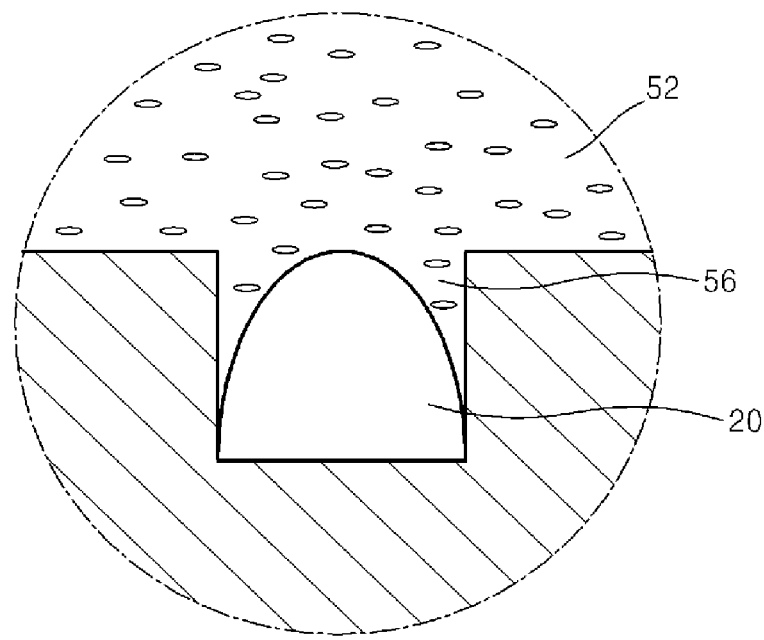

Also, by appropriately including the sublimate solid material and the organic solvents as the groove filling material, or appropriately adjusting the shape of the groove filling material filling each of the grooves 20 together with or separately from the above inclusion, as shown in FIG. 13, the intrusion portion 56 or an insertion portion of the sintered body 52 can be formed. Accordingly, a space for the passage of vapor is sufficiently obtained and the contact portion between the sintered body 52 and the heating plate 10 increases so that heat transport is effectively performed.

Figure 14:
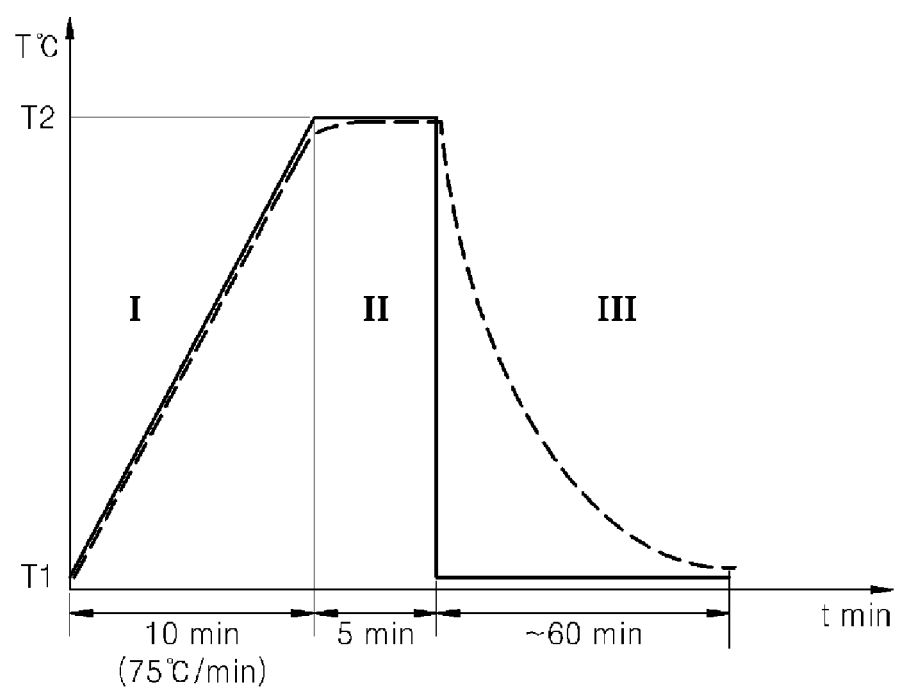
FIG. 14 is a graph showing a relationship between heating time and heating temperature as two axes.

A sintering environment including temperature and time in the sintering operation S5 in the present embodiment will be described below with reference to FIG. 14. The sintering operation S5 includes a heating section I, a temperature maintenance section II, and a cooling section III. In the heating section I, the temperature in a sintering furnace rises to a maintenance temperature T2 from a start temperature T1 that is generally the room temperature. Although the temperature conduction is changed according to environment conditions, a wick material, or an equipment used therefor, for example, the furnace, when nickel or metal powder is used for a hot pressing with uniaxial pressurization in a vacuum state as in the present embodiment, the heating speed is in a range of 60-80° C./min, the maintenance temperature is within a range of 600-800° C., and the maintenance time is within a range of 5-30 min. The above conditions are for obtaining a porosity of 60% or more of the formed sintered body. The range of the temperature condition may vary according to a target porosity (permeability).

In the temperature maintenance section II, the maintenance temperature T2 is maintained for a predetermined maintenance time. In the present embodiment, the maintenance time is five minutes. However, the maintenance time may be a range of 5-30 minutes according to the type of a sintering metal and the maintenance temperature T2.

In the cooling section III, the temperature in the furnace is cooled down from the maintenance temperature T2 to the start temperature T1 that is room temperature. The time required for the cooling section III is preferably within 30-60 minutes, particularly, 60 minutes in the present embodiment. Although a separate cooling means may be provided for cooling, cooling may be achieved by natural convection down to the start temperature T1 in a room temperature environment without heating and any separated cooling means.

Also, in the present embodiment, the surrounding environment during sintering is the vacuum state within a range of not more than $10^{-3}$ Torr or an inactive gas environment. To embody the sintering environment, the sintering is preferably performed in a sealed chamber. FIG. 14 shows the control temperature.

Also, a cover member 16 is provided at an upper end portion of the side wall portion of the heating plate 10. The liquid transportation pipe 230 is coupled to the cover member 16 so that the working fluid in a liquid state flows into an inner space of the evaporator 1 from the condenser 210. The coupling process of the cover member 16 is performed after the sintering operation S5 is completed.

The operation and effect of the method of manufacturing an evaporator for a loop heat pipe system configured as above is described below. In the conventional evaporator manufacturing method, a complicated process in which, after the sintered body is formed, the grooves are formed in the sintered body and the sintered body is combined to the heating plate, needs to be performed. According to the evaporator manufacturing method of the present invention, the sintered body is formed only by locating the metal powder on the heating plate and performing a sintering process once. In addition, since the sintered body is combined to the heating plate, a manufacturing process is simple so that a manufacturing cost is reduced.

Also, in the conventional evaporator manufacturing method, since a simple pressing method or metal coupling method is employed to combine the heating plate and the sintered body, the coupling state of the coupling boundary surface is not satisfactory. However, in the evaporator manufacturing method according to the present invention, since the metal powder is sintered and simultaneously combined directly to the heating plate, the coupling state of the coupling boundary surface between the sintered body and the heating plate is quite satisfactory, compared to the conventional technology, so that the value of contact conductance is increased.

Also, in the conventional evaporator manufacturing method, since the micro-channels (grooves) functioning as a vapor passage are formed in the sintered wick, the area of the contact surface with the heating plate is not sufficient. As an embodiment of the evaporator manufacturing method according to the present invention, according to the embodiment in which the grooves are formed in the heating plate and the groove filling material fills each of the grooves so that a part of the sintered wick intrudes into each of the grooves, the intrusion portion has a portion coupled to both sides surfaces of each of the grooves. Thus, as the area of the contact surface that is referred to as a heating area or a coupling area increases, the value of contact conductance increases. In other words, heat contact resistance is reduced. Also, the amount of the working fluid that is evaporated at the coupling boundary surface increases, which means an increase in mass flow rate (kg/g) of vapor.

According to the method of manufacturing an evaporator for a loop heat pipe according to the present invention, the shape of the intrusion portion of the sintered wick can be formed into a desired shape by adjusting the groove filling material. To adjust the formation of the intrusion portion of the sintered wick into each of the grooves, the groove filling material may include the organic solvents or the shape of the upper surface of the groove filling material filling each of the grooves may be adjusted. By adjusting the shape of the intrusion portion of the sintered wick in each of the grooves, the shape of a section in the space of each of the grooves functioning as the vapor passage can be adjusted to a desired shape.

In the evaporator manufactured by the method of the present invention, compared to the evaporator according to the conventional technology, the coupling state of the contact surface is satisfactory, the area of the contact surface increases according to the embodiment, and the evaporation area where the working fluid evaporates increases. Thus, the value of contact conductance between the sintered body and the heating plate is high. The state of the contact boundary surface between the sintered body and the heating plate in the evaporator manufactured in the method according to the present invention can be distinguished over the state of the contact boundary surface according to the conventional simple pressing method or the metal coupling method such as re-sintering.

As described above, according to the method of manufacturing an evaporator according to the present embodiment, since not only the sintered body is formed, but also the sintered body and the heating plate are coupled together, if only the metal powder is positioned on the heating plate and the sintering process is performed once, a simple manufacturing process can be obtained and a manufacturing cost can be reduced.

Also, since the metal powder is directly coupled to the heating plate while being sintered, a coupling state between the sintered body and the heating plate is improved compared to the conventional technology so that the value of contact conductance can be increased.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing an evaporator for a loop heat pipe system, the method comprising:
    processing a plurality of grooves, each of the grooves having a concave and lengthy shape, in a surface of a heating plate that is formed of metal;
    filling the grooves of the heating plate with a groove filling material comprising a sublimate solid material;
    positioning a jig on side surface of the heating plate where the grooves are formed;
    filling spaces formed between the side surface of the heating plate and the jig with metal powder; and
    sintering the metal powder by applying heat to the metal powder to form a porous sintered wick, wherein the sublimate solid material is vacated from the grooves to form empty spaces and the sintered wick is formed above the empty spaces.

2. The method of claim 1, wherein the sublimate solid material is naphthalene.

3. The method of claim 1, wherein the groove filling material comprises an organic solvents.

4. The method of claim 3, wherein the organic solvents comprises at least one of ether and alcohol.

5. The method of claim 1, wherein the metal powder is nickel and the heating plate is copper, the sintering step comprises a heating section in which temperature increases from a start temperature to a temperature maintenance temperature, a temperature maintenance section in which the maintenance temperature is maintained for a predetermined maintenance time, and a cooling section in which the maintenance time is cooled down to the start temperature, in the heating section, a heating time is not greater than 10 minutes and a heating speed is 60-80° C/min, in the temperature maintenance section, the maintenance temperature is within a range of 600-800° C. and a maintenance time is within a range of 5-30 minutes, in the cooling section, a duration time of cooling is within a range of 30-60 min, and environment during the sintering operation is a vacuum state within a range of not more than $10^{-3}$ Torr or an inactive gas environment.

6. The method of claim 1, wherein, in the groove processing step, each of the grooves has side surfaces separated from each other to face each other and a bottom surface and the side surfaces are processed to have a predetermined height and, in the groove filling step, the groove filing material fills each of the grooves except for at least upper portions of the side surfaces of each groove.

7. The method of claim 1, wherein, in the groove filling step, an upper surface of the groove filling material filling each of the grooves has one of an downwardly bulging shape, an upwardly depressed shape, and a flat shape.

* * * * *